US006967526B1

(12) United States Patent
Churchill

(10) Patent No.: US 6,967,526 B1
(45) Date of Patent: Nov. 22, 2005

(54) LOW TEMPERATURE COEFFICIENT INPUT OFFSET VOLTAGE TRIM WITH DIGITAL CONTROL

(75) Inventor: Simon Bevan Churchill, Whitchurch (GB)

(73) Assignee: Maxim Integrated Products, Inc., Sunnyvale, CA (US)

( * ) Notice: Subject to any disclaimer, the term of this patent is extended or adjusted under 35 U.S.C. 154(b) by 67 days.

(21) Appl. No.: 10/783,691

(22) Filed: Feb. 20, 2004

(51) Int. Cl.[7] .............................................. H03F 1/02
(52) U.S. Cl. .......................... 330/9; 330/256; 330/261
(58) Field of Search .......................... 330/9, 256, 252, 330/253, 258, 261; 327/307

(56) References Cited

U.S. PATENT DOCUMENTS

| | | | | |
|---|---|---|---|---|
| 5,432,475 A | * | 7/1995 | Fukahori | 330/261 |
| 5,610,557 A | * | 3/1997 | Jett, Jr. | 330/261 |
| 5,764,101 A | * | 6/1998 | Archer | 330/253 |
| 6,194,962 B1 | * | 2/2001 | Chen | 330/9 |
| 6,396,339 B1 | * | 5/2002 | Jacobs | 330/9 |

* cited by examiner

Primary Examiner—Lam T. Mai
(74) Attorney, Agent, or Firm—Blakely, Sokoloff, Taylor & Zafman LLP

(57) ABSTRACT

Low temperature coefficient input offset voltage trim with digital control for bipolar differential transistor amplifiers. The differential input pair of transistors are biased with a current proportional to absolute temperature. Trim current components are generated which also are proportional to absolute temperature and selectively coupled to at least one of the resistive loads to compensate for the original input offset. Control of the coupling of the trim current components preferably is by way of a control word written to and held in a control register. Use of an R-2R ladder using equal trim currents controllably coupled to the nodes of the ladder provide a binary progression in available trim currents. Other embodiments are also disclosed.

32 Claims, 3 Drawing Sheets

LOW TEMPERATURE COEFFICIENT INPUT OFFSET VOLTAGE TRIM WITH DIGITAL CONTROL

BACKGROUND OF THE INVENTION

1. Field of the Invention

The present invention relates to the field of bipolar differential amplifiers.

2. Prior Art

Input offset voltage trimming, both at wafer sort and final test, has been used in various guises for decades.

It has long been known that the best noise and offset performance is obtained from an input stage comprised of a resistively loaded long tailed pair followed by subsequent gain stages. Such a configuration is shown in outline in FIG. 1. There are many ways to trim the input referred offset voltage but the preferred method is by modifying the current in R1 and R2. This can be accomplished, as shown, by changing the value of one of the load resistors, adding a compensating voltage or adding a compensating current. The correction circuitry needs to be implemented for both resistor loads as the error distribution is bipolar.

DETAILED DESCRIPTION OF THE PREFERRED EMBODIMENTS

Figure 1:
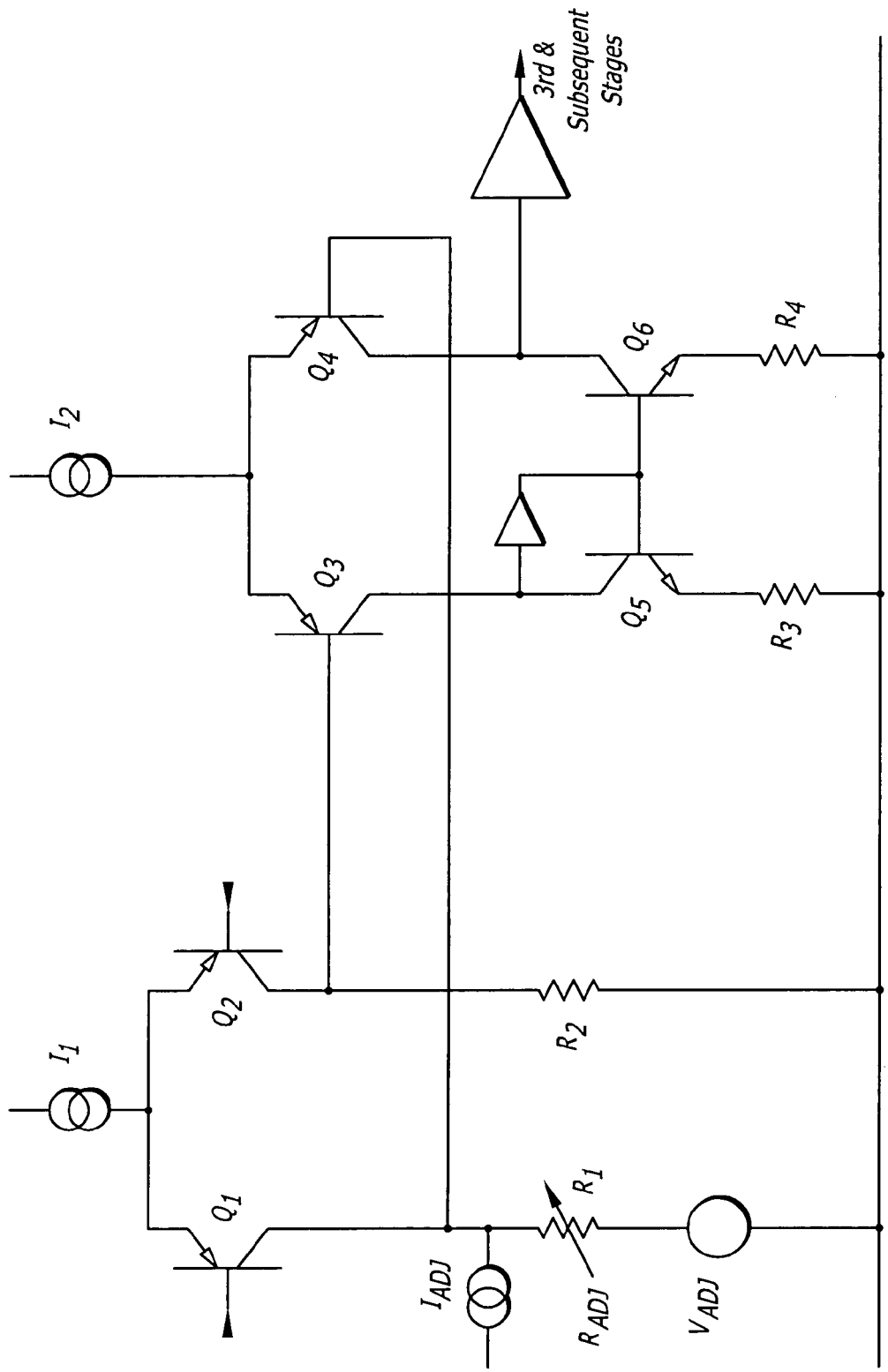
FIG. 1 is a diagram of a bipolar differential amplifier illustrating various ways of adjusting the input offset of the amplifier.

The present invention provides a means of trimming the input offset voltage of an amplifier to approximately zero in a manner resulting in a low temperature coefficient of that offset voltage. The trim mechanism does not degrade inherent noise or offset parameters compared to an untrimmed amplifier. In addition, the trim can be performed under logic signal control, permitting post-package trimming or future recalibration after aging.

Justification for the preferred method of the present invention is given in the following analysis of factors that contribute to the input referred offset voltage. Note that the mismatch in Vbe between a matched pair of BJTs (bipolar junction transistors) is given by:

$$\Delta Vbe = v_T * \ln\left(\frac{Ic1}{Ic2} * \frac{Area2}{Area1}\right)$$

where:
  $V_T$ is the thermal voltage (KT/q)
  Ic1 and Ic2 are the collector currents of transistors Q1 and Q2
  Area1 and Area2 are the areas of transistors Q1 and Q2
  Alternatively, Ic1/Area1 and Ic2/Area2 are the current densities in the transistors Q1 and Q2

The gain of a resistively loaded long tailed BJT pair is:

$$G = \frac{gm * Rc}{1 + gm * \frac{Rb'}{\beta} + gm * RE\left(\frac{1+\beta}{\beta}\right)}$$

where:
  gm is the transconductance of each transistor
  Rc is the collector load resistance
  Rb' is the extrinsic base resistance
  β is the current gain of each transistor
  RE is the extrinsic emitter resistance This gain is temperature independent if the tail bias current is set to ensure that:

$$Ic = \frac{G * V_T}{Rc - \frac{G * Rb'}{\beta} - \frac{G * (\beta+1) * RE}{\beta}}$$

That is to say, a PTAT (proportional to absolute temperature) characteristic for transistors with large β and low extrinsic resistances.

Transistors Q1 and Q2
  ΔVbe—the compensating current will restore the collector current densities to equality. The logarithmic term then becomes zero, and remains zero for all temperatures. This is valid whether $I_1$ is PTAT or constant, if $I_{ADJ}$ is a fixed proportion of $I_1$.

Resistors R1 and R2
  ΔR—this is equivalent to an area mismatch in transistors Q1 and Q2 in that it causes a current density mismatch, and hence a ΔVbe in transistors Q1 and Q2, so the reasoning for ΔVbe is valid here also.

Transistors Q3 and Q4
  ΔVbe—if the ratio of their collector currents (current densities) remains constant over temperature, then this error will be PTAT. Here again, this will be true, whether the tail current $I_2$ is PTAT or not. If the compensation current $I_{ADJ}$ is also PTAT, then this error voltage can be directly compensated over temperature. While the ΔVbe of transistors Q1 and Q2 may be compensated whether the tail current $I_1$ is PTAT or not, simultaneous compensation of the ΔVbe of transistors Q3 and Q4 mandates that $I_1$ also have a PTAT characteristic if the compensation of both transistor pairs is to be accomplished by injection of an appropriate fraction of $I_1$ as a compensating current into the collector circuit of one of transistors Q1 and Q2.

Δβ—beta increases with temperature such that if the transistor is biased with a PTAT current, the resulting base current that is roughly constant over temperature would produce a corresponding offset voltage into resistors R1 and R2. If this voltage is compensated at room temperature by a PTAT $I_{ADJ}$, then over temperature the resultant PTAT error, divided by the first stage gain, will appear at the input.

If transistors Q3 and Q4 are biased with a constant current, then the resultant offset voltage into resistors R1 and R2 can be compensated roughly over temperature by a PTAT IADJ. Any resultant error is divided by the first stage gain before appearing as an input referred input offset voltage.

Transistors Q5 and Q6
  ΔVbe—the mismatch voltage, when applied to resistors R3 and R4, produces a fixed PTAT current error on top of the intended bias current $I_2/2$. In order for the ratio of the collector currents to be temperature invariant, as required by transistors Q3 and Q4, current source $I_2$ must be PTAT. In this case, the $\Delta$Vbe is correctly compensated by $I_{ADJ}$.

Resistors R3 and R4

$\Delta$R—this is equivalent to an area mismatch and hence a $\Delta$Vbe in Q5 and Q6, so that same reasoning as for $\Delta$Vbe is valid.

The circuit in FIG. 1 is intended to help show the requirements for a circuit that exhibits low input offset voltage temperature drift after offset nulling, namely:

1. A symmetrical resistively loaded long tailed pair that is PTAT biased.
2. A symmetrical high gain second stage that is biased with a constant current if base current mismatch in transistors Q3 and Q4 dominates second stage input referred offset voltage contributions, else it is biased by a PTAT current.

This particular configuration does not allow the input common mode range to reach down to ground. However, it is relatively simple to reconfigure the second stage to enable a common mode range that includes ground without contravening the requirements or significantly degrading the efficacy of the solution. Similarly, other configurations using standard circuit techniques and optimized for alternative performance parameters can be devised without contravening the requirements.

There is a trend towards lower power circuitry, particularly as the level of integration increases. The value of $I_{ADJ}$ is normally only a few percent of $I_1$. The trim range is normally split into $2^N$ steps, where N is the number of digital control lines, to enable accurate input offset voltage nulling. Normally the generation of a small current in much smaller accurate increments requires very large device geometries and hence consumes an undesirable area of silicon. The present invention, as shown in FIG. 2, provides an economical solution for low power circuits.

Figure 2:
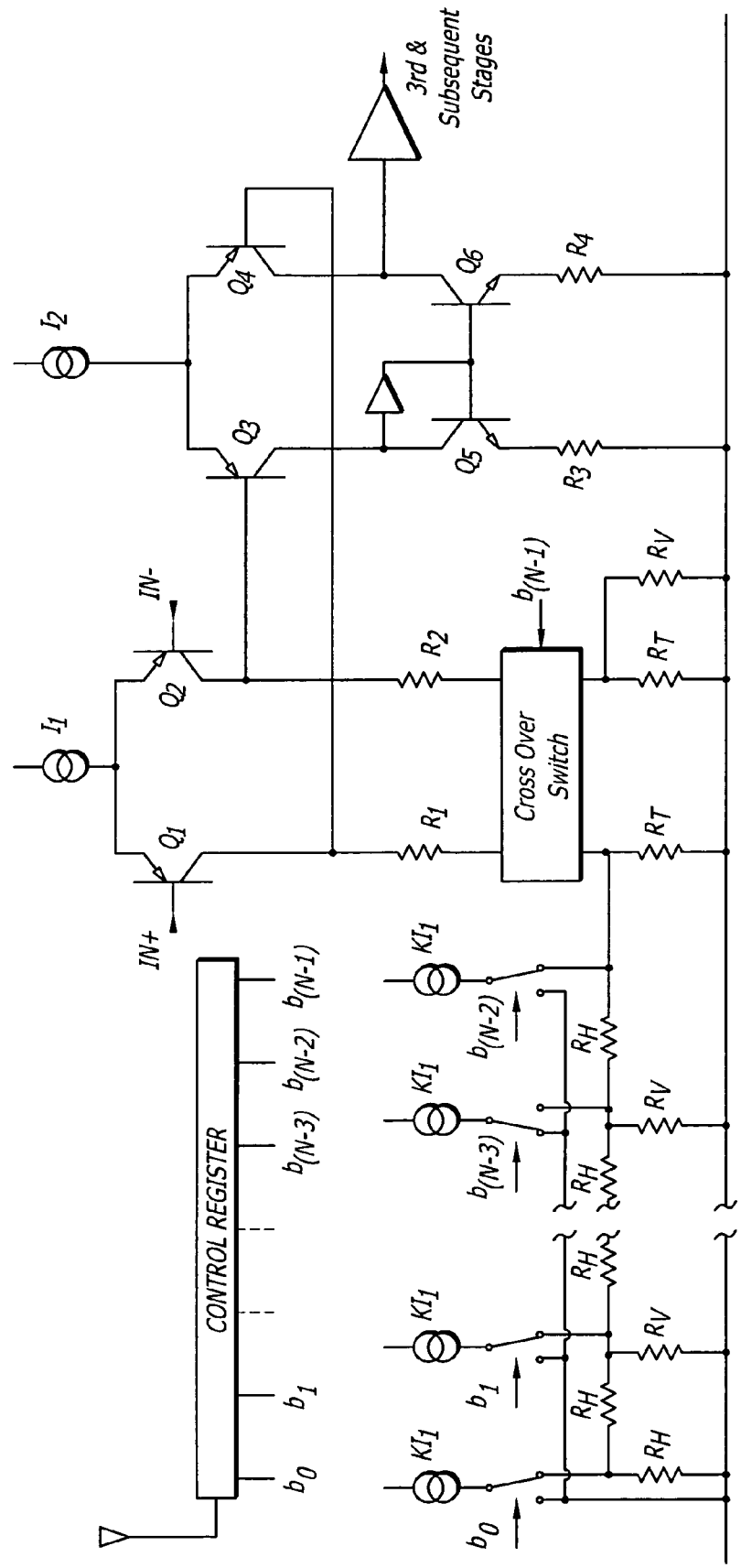
FIG. 2 is a circuit diagram for a preferred embodiment of the present invention.

The circuit in FIG. 2 is substituted for the collector loads R1 and R2 in FIG. 1. The circuit comprises an R-2R ladder, represented by $R_H$ and $R_V$, fed by N-1 identical switched current sources that are proportional replicas of $I_1$ in FIG. 1. This forms a binarily scaled current divider that feeds the resultant current into load resistors $R_T$. The current can be shown to be equivalent to a compensation current, as shown in FIG. 1, of:

$$I_{ADJ} = k * I_1 * \left(\frac{R_V}{R_V + R_T}\right) * \left(\frac{R_T}{R_T + R_C}\right) * \sum_{n=0}^{n=N-2} \frac{b_n * 2^n}{2^{N-2}}$$

where:
$b_N$=0 or 1, depending on the respective switch setting

Referring again to FIG. 2, adding the compensation current $I_{ADJ}$ to one of the trim resistors $R_T$ does not change the effective load resistance of that leg, as the current sources $kI_1$ are high impedance sources. Instead, it is equivalent to adding an input offset adjustment voltage in that leg of $V_{ADJ}=I_{ADJ}*R_T$. It is also equivalent to increasing the value of the respective resistor $R_T$ so that the same current through the respective transistor will cause a higher voltage drop across the resistors making up its load.

For the binary scaling, it is necessary that $R_V=2*R_H$, but there is no ratiometric constraint on $R_T$ with respect to $R_H$. The crossover switch is controlled by the MSB and switches $I_{ADJ}$ from one side to the other which enables compensation of bipolar distributions with only one network. The current source $I_2$ preferably is a constant current if base current mismatch in transistors Q3 and Q4 dominates second stage input referred offset voltage contributions, or alternatively is preferably biased by a PTAT current, typically proportional to $I_1$.

In FIG. 2, typically the trim resistors $R_T$ are a small percent of the primary load resistors $R_C$. Since the resistance looking into the R-2R ladder is $R_V$, a parallel resistance $R_V$ is shown in the opposite leg to nominally balance the load resistance. Obviously, this resistance may be combined with the resistance of the associated trim resistor $R_T$ as a single resistor. The crossover switch is a two pole, double throw transistor switch, allowing either leg of the trim resistor network to be coupled to either leg of the transistor pair Q1 and Q2—load resistors $R_C$, depending on the polarity of the initial input offset voltage.

As an alternative, the resistance $R_V$ shown in parallel in the left leg of FIG. 2 could instead have a higher resistance, or its resistance may be omitted. Since the effective resistance of the R-2R ladder is $R_V$, and the effect of the adjustment current is equivalent to increasing the value of the resistor $R_T$, the differential input stage will now nominally be biased for an input offset voltage of a fixed polarity, preferably slightly more than the maximum input offset expected. By proper selection of resistor ratios and other parameters, the range of input offset adjustment available may be set at twice the nominally biased input offset. Now the full expected range of input offset may be compensated by the adjustment current $I_{ADJ}$ without requiring the crossover switch to control the polarity of the input offset as seen by the trim resistors $R_T$. One more bit in the R-2R ladder would be needed to obtain the same minimum increment in adjustability, though no more bits overall would be needed for the adjustment because of the elimination of the crossover switch and its control. Since both a $\Delta$Vbe in transistors Q1 and Q2 and a load resistor imbalance are compensated for by a PTAT $I_{ADJ}$, this compensation of the offset of the differential input stage is also good with temperature variations.

Figure 3:
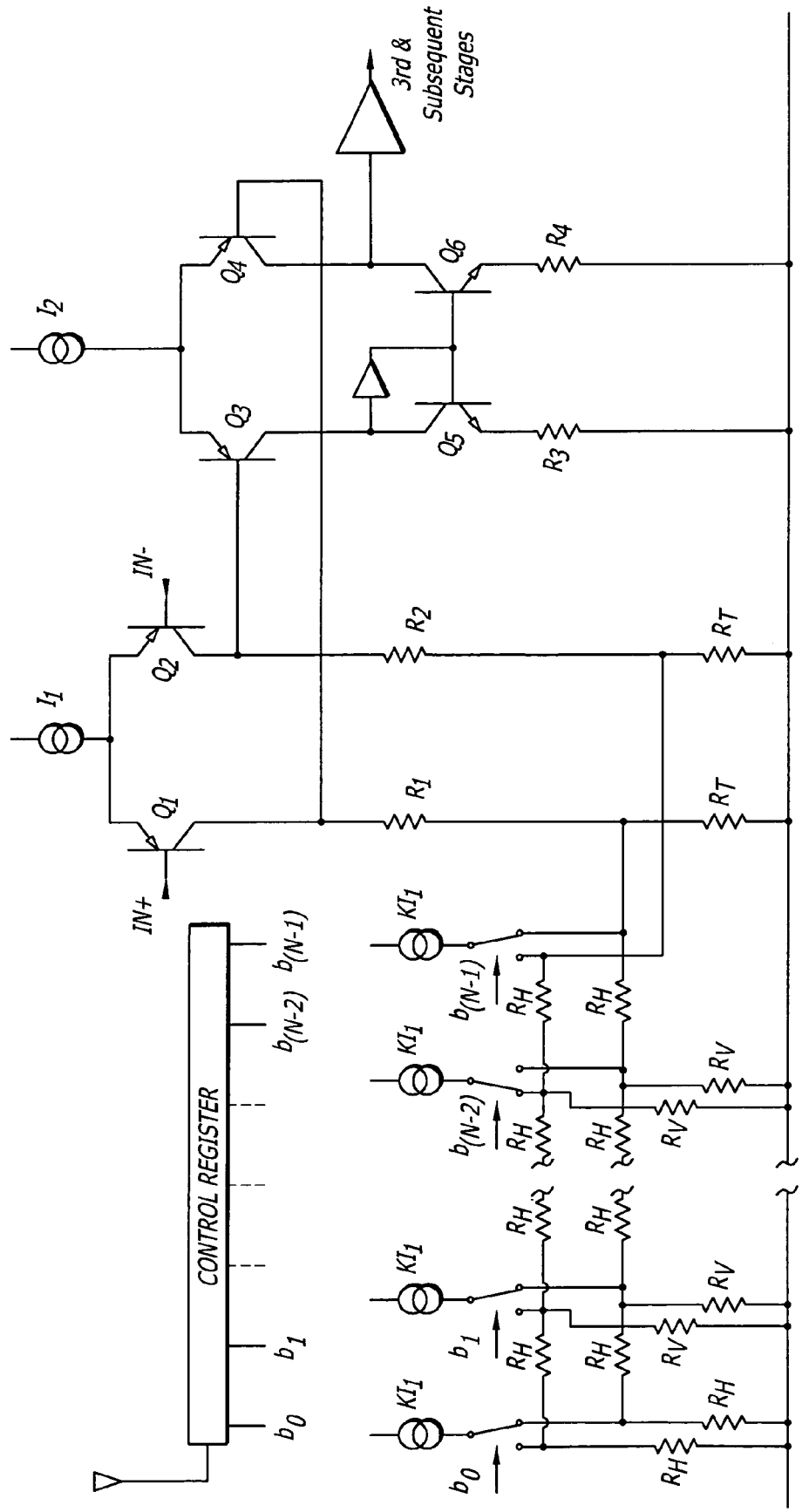
FIG. 3 is a circuit diagram for an alternate embodiment.

Referring again to FIG. 2, it may be seen that any one or more $kI_2$ current sources may be switched into a respective node of the R-2R ladder, or coupled to ground. The either/or coupling is preferred over an open circuit, as it provides a fixed load on the current sources, independent of their switch settings. As a further alternative, however, the $R_V$ resistance in the left leg of FIG. 2 may be eliminated, and in its place and as a replacement for the "or coupled to ground" connections, a second R-2R ladder could be provided (see FIG. 3). Now any $I_{ADJ}$ current source component may be coupled into either leg, allowing input offset voltage adjustment of either polarity and again eliminating the need for the crossover switch. Again, the crossover switch control bit may be used instead as an additional control bit for one bit longer R-2R ladders. Also now, each current source has twice the effect, though the additional (lower order) bit in the R-2R ladders makes up for this difference.

In all of the foregoing embodiments, the control of the crossover switch and/or the switches controlling the binary increments of the compensation current $I_{ADJ}$ may be the same. Preferably a simple serial interface is used to set a nonvolatile register (see FIG. 2) for storing one control bit for each switch. In this way, amplifier input offset compensation may be done after packaging to also compensate for packaging stresses, and/or may be done after aging, or as often in use as the user desires, typically but not necessarily under software control. The serial interface minimizes pin count, as the present invention amplifiers are normally realized in integrated circuit form as one or more such amplifiers on a single integrated circuit, alone or with other circuitry. Other interfaces, or permanent compensation setting by blowing fuses, etc. could be used, though are not preferred.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A method of input offset voltage compensation in a bipolar transistor differential amplifier having resistive loads on the bipolar transistor differential input pair comprising:
    biasing the differential input pair with a bias current proportional to absolute temperature;
    splitting the resistive loads into series combinations of a primary resistance and a trim resistance;
    coupling a trim current source output to a trim resistances, the trim current source comprising a plurality of proportional to absolute temperature current source components individually controllably switchable to the trim current source output, each contributing a respective trim current component to the trim current source in a binary progression; and,
    switching selected proportional to absolute temperature current source components to the trim current source output to minimize the input offset voltage of the differential amplifier.

2. The method of claim 1 wherein the plurality of proportional to absolute temperature current source components are equal current components proportional to the current biasing the differential input pair, each current source component being switchable to a respective node of an R-2R network.

3. The method of claim 2 wherein switching selected proportional to absolute temperature current source components to the trim current source comprises loading a switch control word into a control register, each bit of the control word controlling a respective switch.

4. The method of claim 3 wherein the control word is provided through a digital interface.

5. The method of claim 1 further comprised of coupling the trim current source output to a predetermined one of the trim resistances, coupling a crossover switch in series with the resistive loads, and controlling the crossover switch to predetermine which trim resistance requires trim current for input offset voltage compensation.

6. The method of claim 1 wherein the differential amplifier includes a symmetrical high gain second stage and further comprising biasing the second stage with a constant current.

7. The method of claim 1 wherein the differential amplifier includes a symmetrical high gain second stage and further comprising biasing the second stage with a current proportional to absolute temperature.

8. A method of input offset voltage compensation in a bipolar transistor differential amplifier having resistive loads on the bipolar transistor differential input pair comprising:
    biasing the differential input pair with a bias current proportional to absolute temperature;
    coupling a trim current source output to at least one of the resistive loads, the trim current source comprising a plurality of proportional to absolute temperature current source components individually controllably switchable to the trim current source output; and,
    switching selected proportional to absolute temperature current source components to the trim current source output to minimize the input offset voltage of the differential amplifier.

9. The method of claim 8 wherein switching selected proportional to absolute temperature current source components to the trim current source comprises loading a switch control word into a control register, each bit of the control word controlling a respective switch.

10. The method of claim 9 wherein the control word is provided through a digital interface.

11. The method of claim 8 further comprising splitting the resistive loads into series combinations of a primary resistance and a trim resistance, and coupling the trim current source output to at least one of the trim resistances.

12. The method of claim 8 wherein the proportional to absolute temperature current source components contribute respective trim current components to the trim current source in a binary progression.

13. The method of claim 12 wherein the plurality of proportional to absolute temperature current source components are equal current components proportional to the current biasing the differential input pair, each being switchable to a respective node of an R-2R network.

14. The method of claim 8 further comprised of coupling a crossover switch in series with the resistive loads and controlling the crossover switch to predetermine the initial polarity of the input offset voltage to be compensated.

15. The method of claim 8 wherein the differential amplifier includes a symmetrical high gain second stage and further comprising biasing the second stage with a constant current.

16. The method of claim 8 wherein the differential amplifier includes a symmetrical high gain second stage and further comprising biasing the second stage with a current proportional to absolute temperature.

17. In a bipolar transistor differential amplifier, the improvement comprising:
    a bipolar transistor differential input pair, each transistor having as a load a series combination of a primary resistance and a trim resistance;
    a proportional to absolute temperature current source biasing the differential input pair; and,
    a trim current source having an output coupled to at least one of the trim resistances, the trim current source comprising a plurality of proportional to absolute temperature current source components individually controllably switchable to the trim current source output, each contributing a respective trim current component to the trim current source in a binary progression.

18. The improvement of claim 17 further comprising an R-2R network and wherein the plurality of proportional to absolute temperature current source components are equal current components proportional to the current biasing the differential input pair, each being switchable to a respective node of the R-2R network.

19. The improvement of claim 18 further comprising a register holding a control word controlling the switching of individual proportional to absolute temperature current source components.

20. The improvement of claim 19 further comprising a digital interface coupled to the register for inputting a control word to the register.

21. The improvement of claim 17 further comprised of a crossover switch in series with the resistive loads, a control word in the control register also controlling the crossover switch.

22. The improvement of claim 17 further comprising a symmetrical high gain second stage biased with a constant current.

23. The improvement of claim 17 further comprising a symmetrical high gain second stage biased with a current proportional to absolute temperature.

24. In a bipolar transistor differential amplifier, the improvement comprising:
   a bipolar transistor differential input pair, each transistor having a resistive load;
   a proportional to absolute temperature current source biasing the differential input pair; and,
   a trim current source having an output coupled to at least one of the resistive loads, the trim current source comprising a plurality of proportional to absolute temperature current source components individually controllably switchable to the trim current source output, each contributing a respective trim current component to the trim current source.

25. The improvement of claim 24 further comprising a register holding a control word controlling the switching of individual proportional to absolute temperature current source components.

26. The improvement of claim 25 further comprising a digital interface coupled to the register for inputting a control word to the register.

27. The improvement of claim 24 wherein at least one resistive load comprises a series combination of a primary resistance and a trim resistance, the trim current source output being coupled to at least one of the trim resistances.

28. The improvement of claim 24 wherein the proportional to absolute temperature current source components each contribute a respective trim current component to the trim current source in a binary progression.

29. The improvement of claim 24 further comprising an R-2R network and wherein the plurality of proportional to absolute temperature current source components are equal current components proportional to the current biasing the differential input pair, each being switchable to a respective node of the R-2R network.

30. The improvement of claim 24 further comprised of a crossover switch in series with the resistive loads and controlling the crossover switch to predetermine which resistive load is coupled to which compensated bipolar transistor.

31. The improvement of claim 24 further comprising a symmetrical high gain second stage biased with a constant current.

32. The improvement of claim 24 further comprising a symmetrical high gain second stage biased with a current proportional to absolute temperature.

* * * * *